(12) United States Patent
Zhang et al.

(10) Patent No.: US 10,784,389 B2
(45) Date of Patent: Sep. 22, 2020

(54) FULL-LASER SCRIBING METHOD FOR FLEXIBLE STAINLESS STEEL SUBSTRATE SOLAR CELL MODULE

(71) Applicants: Beijing Sifang Crenergey Optoelectronics Technology Co., Ltd., Beijing (CN); Beijing Sifang Automation Co., Ltd, Beijing (CN)

(72) Inventors: Ning Zhang, Beijing (CN); Xinping Yu, Beijing (CN); Wanlei Dai, Beijing (CN); Yuandong Liu, Beijing (CN); Wei Zhang, Beijing (CN); Zhe Sun, Beijing (CN)

(73) Assignees: Beijing Sifang Crenergey Optoelectronics Technology Co., Ltd., Beijing (CN); Beijing Sifang Automation Co., Ltd., Beijing (CN)

( * ) Notice: Subject to any disclaimer, the term of this patent is extended or adjusted under 35 U.S.C. 154(b) by 15 days.

(21) Appl. No.: 16/313,215

(22) PCT Filed: Dec. 28, 2016

(86) PCT No.: PCT/CN2016/000716
§ 371 (c)(1),
(2) Date: Dec. 26, 2018

(87) PCT Pub. No.: WO2018/072054
PCT Pub. Date: Apr. 26, 2018

(65) Prior Publication Data
US 2019/0237600 A1     Aug. 1, 2019

(30) Foreign Application Priority Data

Oct. 17, 2016 (CN) .......................... 201610900989

(51) Int. Cl.
*H01L 31/0392*     (2006.01)
*H01L 31/18*       (2006.01)
(Continued)

(52) U.S. Cl.
CPC ...... *H01L 31/03928* (2013.01); *B23K 26/361* (2015.10); *B23K 26/402* (2013.01);
(Continued)

(58) Field of Classification Search
CPC ........... H01L 31/03928; H01L 31/1876; H01L 31/0463; H01L 31/03923; H01L 31/186; B23K 26/402; B23K 26/361; Y02P 70/521
(Continued)

(56) References Cited

U.S. PATENT DOCUMENTS

| 2012/0111388 A1* | 5/2012 | Sung ................... H01L 31/0392 136/244 |
| 2015/0068578 A1* | 3/2015 | Probst ............. H01L 31/022425 136/244 |
| 2018/0114876 A1* | 4/2018 | Zhang ................. H01L 31/0463 |

FOREIGN PATENT DOCUMENTS

| CN | 101093863 A | 12/2007 |
| CN | 102255006 A | 11/2011 |

(Continued)

*Primary Examiner* — Caleen O Sullivan
(74) *Attorney, Agent, or Firm* — Muirhead and Saturnelli, LLC (57) ABSTRACT

The invention relates a full-laser scribing method for a flexible stainless steel substrate solar cell module, comprising: preparing an insulating layer and a molybdenum layer on a stainless steel substrate in sequence; using a laser I to scribe the prepared insulating layer and molybdenum layer to form a first scribed line (P1); preparing the following film layers in sequence on the molybdenum layer in which P1 has been scribed: a CIGS layer, a cadmium sulfide layer and an intrinsic zinc oxide layer; using a laser II to make scribe and
(Continued)

thus form a second scribed line (P2), wherein the second scribed line P2 is parallel with the first scribed line P1; and preparing an aluminum-doped zinc oxide layer on the intrinsic zinc oxide layer in which P2 has been scribed, and using a laser III to make scribe and thus form a third scribed line (P3), wherein the third scribed line P3 is parallel with the first scribed line P1. The invention may avoid disadvantages caused by the screen printing, such as large dead zone, expensive screen printing paste and frequent replacement of screens for screen printing, thereby improve efficiency and stability of the module and save cost and increase production efficiency.

19 Claims, 4 Drawing Sheets

(51) Int. Cl.
  *H01L 31/0463* (2014.01)
  *B23K 26/402* (2014.01)
  *B23K 26/361* (2014.01)

(52) U.S. Cl.
  CPC .... *H01L 31/03923* (2013.01); *H01L 31/0463* (2014.12); *H01L 31/186* (2013.01); *H01L 31/1876* (2013.01); *Y02P 70/521* (2015.11)

(58) Field of Classification Search
  USPC ............................................ 438/86; 136/244
  See application file for complete search history.

(56) References Cited

FOREIGN PATENT DOCUMENTS

| | | | |
|---|---|---|---|
| CN | 103618030 A | 3/2014 | |
| CN | 103746016 A | 4/2014 | |
| CN | 104993013 A | 10/2015 | |
| CN | 105449010 A | 3/2016 | |
| EP | 2889918 A1 * | 7/2015 | ........... H01L 31/202 |

* cited by examiner

Line width of P1
41.51 μm

FIG. 6

Line width of P2
48 μm

FULL-LASER SCRIBING METHOD FOR FLEXIBLE STAINLESS STEEL SUBSTRATE SOLAR CELL MODULE

TECHNICAL FIELD

The present invention relates to a technical field of thin-film solar cells, more particularly, to a method for manufacturing a flexible stainless steel substrate copper-indium-gallium-selenide (CIGS) thin-film solar cell module.

BACKGROUND

Energy crisis and environmental pollution are two fundamental problems the world is facing now. Inexhaustible solar energy is an important way to solve the energy crisis. Because its material has the advantages of tunable optical band gap, strong anti-radiation ability, stable battery performance, excellent weak light tolerance and the like, the CIGS thin-film solar cell has become one of the most promising photovoltaic materials in thin-film solar cells.

According to different substrates, thin-film solar cells may be divided into two types: rigid substrates and flexible substrates. Among them, a flexible-substrate solar cell refers to a cell fabricated on a flexible material (e.g., stainless steel, polyimide). Compared with a crystalline silicon cell and a glass-based cell, the flexible-substrate solar cell has the most significant advantages of being lightweight, bendable and non-breakable. Since a CIGS cell needs to be subjected to selenization at a high temperature of 500 angstroms or above, it is generally adopted in the industry to fabricate a flexible CIGS solar cell on a flexible stainless steel substrate. In the industry of flexible stainless steel substrate CIGS solar cells, a screen printing method is commonly used to lead the current out. The disadvantage of this method lies in that the area of a dead zone accounts for 7% of an entire cell, and the efficiency loss of the module is very high; at the same time, the screen printing process is complicated, has poor process reproducibility and is costly due to high consumption of silver paste; therefore, if the rigid substrate full-laser scribing method (Application No. CN201510271942.8) applied by our Company is used to carry out inner series connection of cells to avoid the disadvantages of the screen printing. However, in the case of a flexible stainless steel substrate, a Mo layer may be scribed off after P1 scribing, and it cannot form the insulating between cells because the stainless steel substrate is conductive. According to the present invention, it is innovative to sputter an insulating layer on a stainless steel substrate to insulate the stainless steel from the Mo layer of a back electrode, and then a full-laser scribing method is adopted to achieve the inner connection of the module. Furthermore, in order to avoid damage to the insulating layer, all scribes are implemented in a defocusing way to avoid damaging the insulating layer. The full-laser scribing method may be performed at a speed of 2-3 m/s due to the laser's repetition frequency of 30 MHz-1 GHz, may reduce the width of the dead zone to 200 µm or less due to small laser scribing spots, thus greatly reducing the power loss of the module after scribing and also achieving high processing efficiency and low production cost. In addition, the laser has the characteristics of stable operation, long service life and the like, thus reducing maintenance cost and production cost of the equipment.

SUMMARY OF THE INVENTION

An object of the present invention is to provide a full-laser scribing method for a flexible stainless steel substrate solar cell module, to complete all three scribes of a CIGS thin-film solar cell to realize inner connection of sub-cells of a solar cell module. As the repetition frequency of a laser reaches 30 MHz-1 GHz, the processing speed may reach 2-3 m/s. Focusing the laser may decrease the scribed line width, reduce or even eliminate the flanging and edge breakage, and reduce the width of the dead zone to 200 µm or below, thus greatly reducing the power loss of the module after scribing, and also ensuring high processing efficiency, reduced consumption of raw materials such as silver paste, and low production cost. In addition, the laser has the characteristics of stable operation, long service life, and the like, thus reducing the maintenance cost of the equipment.

The present invention provides a full-laser scribing method for a flexible stainless steel substrate solar cell module, comprising the following steps:

(1) preparing an insulating layer on a flexible stainless steel substrate;

(2) preparing a molybdenum layer on the insulating layer;

(3) using a laser I to completely scribe off the molybdenum layer to form a first scribed line (P1), wherein the first scribed line (P1) is scribed till reaching the surface of the insulating layer without damaging the insulating layer so that sub-cells at both sides of the first scribed line (P1) are completely insulated without damaging the insulating layer at the bottom, the laser is focused by a focusing lens and then is subjected to beam expansion by a beam expander, and then laser energy is shaped into a flat-topped distribution from a Gaussian distribution by a laser shaping lens, and finally the laser is focused again by a focusing lens, to obtain a flat-topped beam with uniform energy distribution, and the molybdenum layer is scribed off by using the flat-topped beam; (4) preparing a CIGS film layer on the molybdenum layer;

(5) preparing a cadmium sulfide layer on the CIGS film layer;

(6) preparing an intrinsic zinc oxide layer on the cadmium sulfide layer;

(7) using a laser II to scribe off the intrinsic zinc oxide layer, the cadmium sulfide layer and the CIGS layer at the same time to expose the molybdenum layer and thus form a second scribed line (P2), wherein the second scribed line (P2) completely scribes off three thin film layers, i.e., the intrinsic zinc oxide layer, the cadmium sulfide layer and the CIGS layer, without damaging the surface of the molybdenum layer, and the second scribed line (P2) keeps parallel with the first scribed line (P1);

(8) preparing an aluminum-doped zinc oxide layer on the intrinsic zinc oxide layer; and (9) using a laser III to scribe off the aluminum-doped zinc oxide layer, the intrinsic zinc oxide layer, the cadmium sulfide layer and the CIGS layer at the same time to expose the molybdenum layer and form a third scribed line (P3), thus completing inner connection of sub-cells of the CIGS thin-film solar cell module, wherein the third scribed line (P3) needs to completely scribe off four thin film layers, i.e., the aluminum-doped zinc oxide layer, the intrinsic zinc oxide layer, the cadmium sulfide layer and the CIGS layer, without damaging the surface of the molybdenum layer, wherein the third scribed line (P3) keeps parallel with the first scribed line (P1) and the second scribed line (P2).

In an embodiment, the laser I, the laser II and the laser III may all be one or more of a nanosecond laser, a sub-nanosecond laser, or a picosecond laser, wherein the nanosecond laser is a pulse fiber laser with the laser wavelength of one or more than two of 1064 nm, 532 nm and 355 nm, the beam mode of TEM00, the beam quality ($M^2$) of less than 1.3, the pulse width of 1 nanosecond to 600 nanoseconds, the single pulse energy of 1 μJ to 2000 μJ, the pulse repetition frequency of 1 kHz to 1000 kHz, and the average power of 0 to 25 watts; the sub-nanosecond laser is a semiconductor laser with the laser wavelength of one or more than two of 1064 nm, 532 nm and 355 nm, the beam mode of TEM00, the beam quality ($M^2$) of less than 1.3, the pulse width of 600 picoseconds to 2000 picoseconds, the single pulse energy of 1 μJ to 300 μJ, the pulse repetition frequency of 10 kHz to 100 kHz, and the average power of 0 to 3 watts; the picosecond laser is a pulse fiber laser with the laser wavelength of one or more than two of 1064 nm, 532 nm and 355 nm, the beam mode of TEM00, the beam quality ($M^2$) of less than 1.3, the pulse width of less than 10 picoseconds, the single pulse energy of 1 μJ to 40 μJ, the pulse repetition frequency of 1 Hz to 1000 KHz, and the average power of 0 to 6 watts.

In an embodiment, the first scribed line (P1) may be scribed in a mode of film surface incidence or back surface incidence; the mode of film surface incidence means that the laser beams are in the direction of a thin film coated surface and are focused on a thin film surface through a focusing lens; the mode of back surface incidence means that laser beams are in a direction opposite to the thin film coated surface.

In an embodiment, the second scribed line (P2) may be scribed in the mode of film surface incidence.

In an embodiment, the third scribed line (P3) may be scribed in the mode of film surface incidence.

In an embodiment, the insulating layer may be one or more of oxide or nitride materials such as insulated silicon dioxide, silicon nitride, zinc oxide, aluminum oxide, aluminum nitride, and the like, the thickness of the insulating layer is 1.0-2.0 μm, the thickness of the molybdenum layer is 600 nm to 1200 nm, the thickness of the CIGS layer is 1.0 μm to 2.0 μm, the thickness of the cadmium sulfide layer is 30 nm to 80 nm, the thickness of the intrinsic zinc oxide thin film is 50 nm to 150 nm, and the thickness of the aluminum-doped zinc oxide thin film is 300 nm to 1000 nm.

In an embodiment, the first scribed line (P1) is parallel with the edge of the stainless steel substrate, the second scribed line (P2) is parallel with P1, and the third scribed line (P3) is parallel with P1 too; all the parallel lines are implemented by an automatic optical tracking system;

Since the full-laser scribing method of the invention is adopted to achieve the inner connection of the sub-cells of the flexible stainless steel substrate CIGS thin-film solar cell module, the dead zone area of the module may be reduced efficiently, the module power of the CIGS thin-film solar cell is improved, and the use of screen printing in the traditional method is not necessary, thus increasing the production efficiency of the module and reducing the production and maintenance costs.

DETAILED DESCRIPTION OF THE PREFERRED EMBODIMENTS

The technical solution of the present invention will be further described as embodiments below with reference to the accompanying drawings.

Embodiment 1

Figure 1:
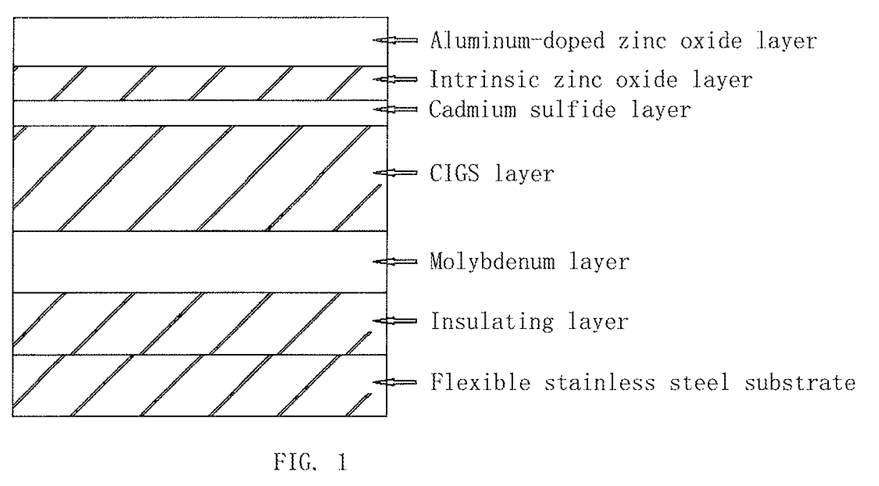
FIG. 1 is a schematic diagram of the structure of the stainless steel substrate solar cell according to the present invention.

FIG. 1 shows the structure of the flexible stainless steel substrate CIGS thin-film solar cell according to the present invention. As shown in FIG. 1, the cell includes a stainless steel substrate, an insulating layer, a molybdenum layer, a CIGS layer, a cadmium sulfide layer, an intrinsic zinc oxide layer and an aluminum-doped zinc oxide layer.

Figure 2:
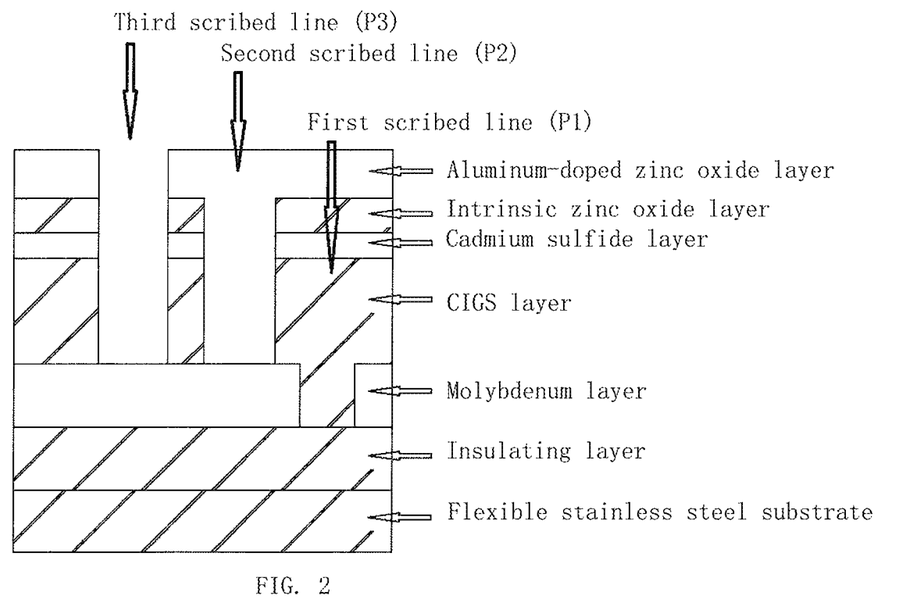
FIG. 2 is a schematic diagram of the full-laser scribing method for a stainless steel substrate solar cell module according to the present invention.

FIG. 2 shows a full-laser scribing method for the flexible stainless steel substrate CIGS thin-film solar cell according to the present invention. As shown in FIG. 2, the full-laser scribing method comprises laser scribing of three scribed lines: first, preparing an insulating layer and a molybdenum film on a flexible stainless steel substrate, and using a laser I to scribe off the prepared molybdenum film to form a first scribed line (P1), wherein the first scribed line (P1) scribes off the molybdenum layer on the insulating layer without damaging the insulating layer, laser is focused by a focusing lens and then is subjected to beam expansion by a beam expander, and then laser energy is shaped into a flat-topped distribution from a Gaussian distribution by a laser shaping lens, and finally the laser is focused again by the focusing lens, to obtain a flat-topped beam with uniform energy distribution to scribe off the molybdenum layer.

In the present application, it is preferable that the following second scribed line (P2) and third scribed line (P3) undergo the same laser shaping.

The following film layers are prepared in sequence on the molybdenum layer in which P1 has been scribed: a CIGS thin film, a cadmium sulfide thin film and an intrinsic zinc oxide thin film; a laser II is used for scribing to form a second scribed line (P2), wherein the scribed line P2 is parallel with the scribed line P1, and copper indium gallium selenide, cadmium sulfide and intrinsic zinc oxide above the molybdenum layer are completely removed due to the second scribed line; and an aluminum-doped zinc oxide layer is prepared on the intrinsic zinc oxide layer in which P2 has been scribed, and a laser III is used for scribing to form a third scribed line (P3), wherein the scribed line P3 is parallel with the scribed line P1, and CIGS, cadmium sulfide, intrinsic zinc oxide, and aluminum-doped zinc oxide above the molybdenum layer are completely removed due to the third scribed line.

According to the present invention, the manufacturing method of the cell comprises the following steps:

Step 1: preparation of an insulating layer on a flexible stainless steel substrate: an insulating intrinsic ZnO film with the thickness of 1.5 μm is prepared on the stainless steel substrate by means of DC magnetron sputtering.

Step 2: preparation of a molybdenum film: a Mo film the thickness of 1 μm is prepared on the surface of the insulating layer by means of DC magnetron sputtering.

Figure 3:
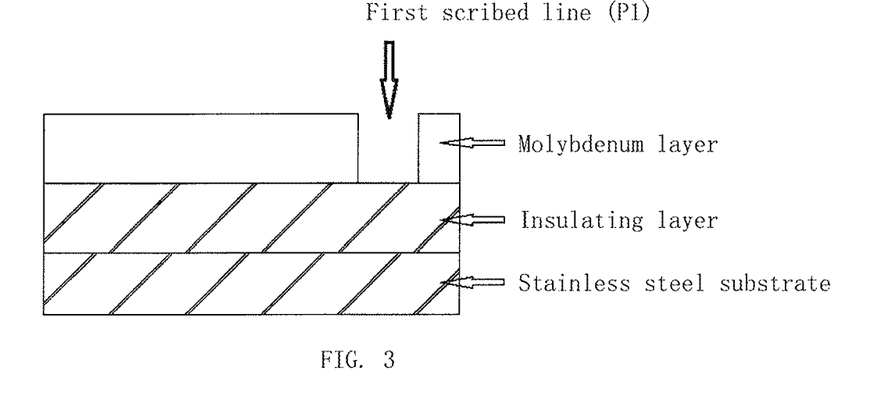
FIG. 3 is a schematic diagram of scribing of P1 according to the present invention.
Figure 6:
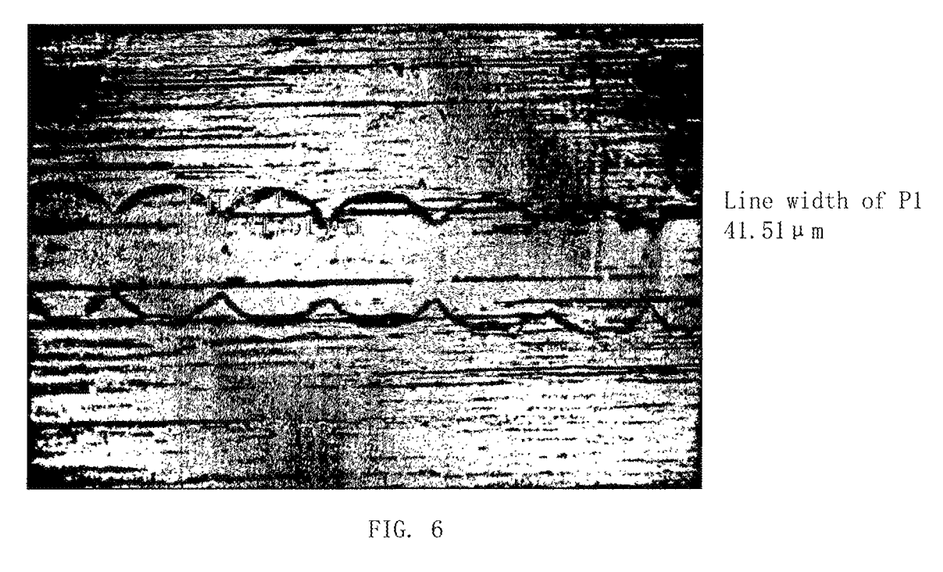
FIG. 6 is a topographic view after the scribing of P1 in Embodiment 1.

Step 3: scribing of P1: a picosecond laser with pulse width of 8 picoseconds, wavelength of 1064 nm, scribing power of 3.0 W, single pulse energy of 37.5 µJ, repetition frequency of 80 kHz is used to scribe P1 in a sample with laser entering from the film-coated surface at a scribing speed of 2 m/s. The width of the scribed line is 41.51 µm, the schematic diagram of the scribing is as shown in FIG. 3, and the molybdenum layer in the scribed line is completely removed to expose the surface of the insulating layer, without damaging the insulating layer. The effect after the scribing is as shown in FIG. 6.

Step 4: preparation of a CIGS thin film: by means of selenylation after magnetization sputtering of a metal preset-film, a CIGS layer with the thickness of 1 µm is prepared on the substrate in which P1 has been scribed.

Step 5: preparation of a cadmium sulfide thin film: a cadmium sulfide layer with the thickness of 50 nm is prepared on the deposited CIGS thin film by a chemical bath deposition method.

Step 6: preparation of an intrinsic ZnO thin film: by means of a DC magnetron sputtering method, an intrinsic ZnO layer with the thickness of 50 nm is prepared on the substrate on which the cadmium sulfide thin film is prepared.

Figure 4:
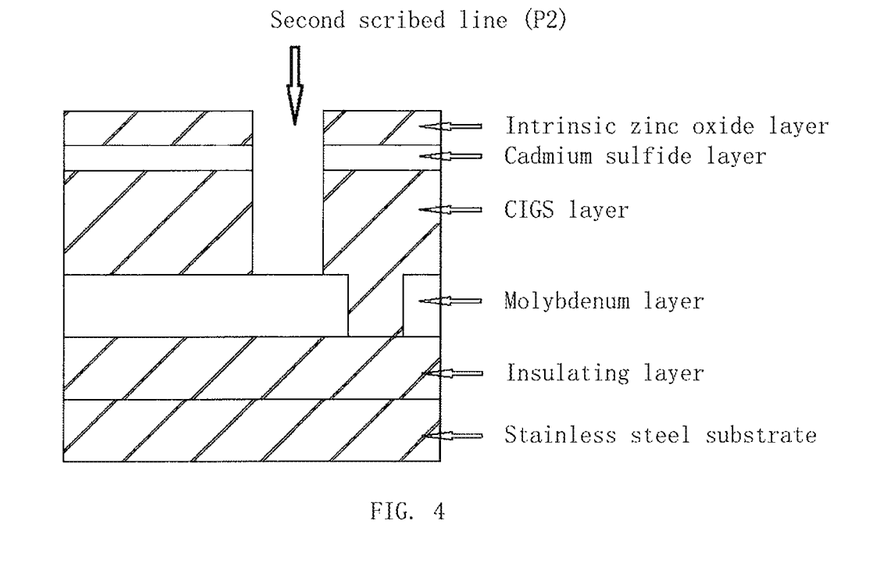
FIG. 4 is a schematic diagram of scribing of P2 according to the present invention.
Figure 7:
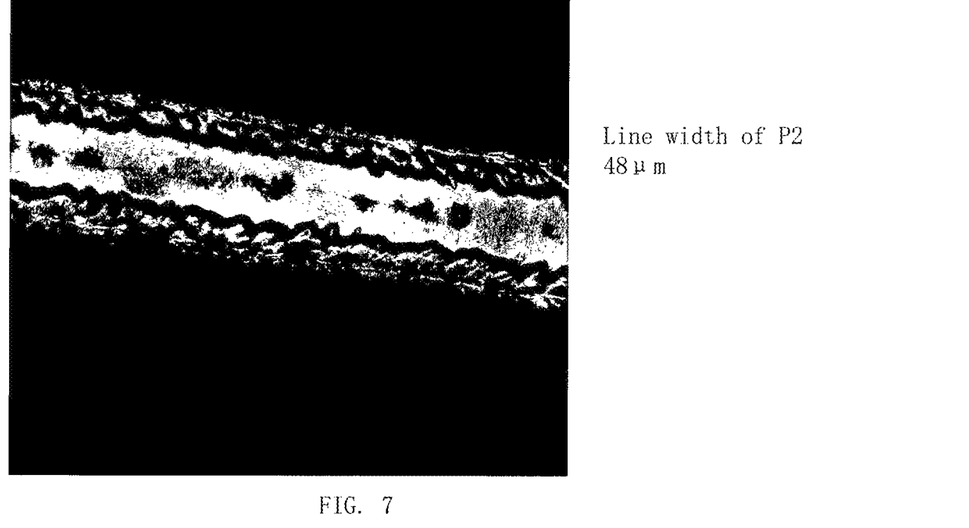
FIG. 7 is a topographic view after the scribing of P2 in Embodiment 1.

Step 7: scribing of P2: a picosecond laser with pulse width of 8 picoseconds, wavelength of 1064 nm, scribing power of 5 W, single pulse energy of 5 µJ, and repetition frequency of 1000 kHz is used to scribe P2 in the sample with laser entering from the film-coated surface at a scribing speed of 2 m/s. The width of the scribed line is 48 µm, the schematic diagram of the scribing is as shown in FIG. 4, and the intrinsic zinc oxide, cadmium sulfide and CIGS of the cell are completely scribed off to expose the molybdenum layer; and the effect after the scribing is as shown in FIG. 7. An automatic tacking system is used to make sure that the scribed line P2 is parallel with the scribed line P1.

Step 8: Preparation of an aluminum-doped zinc oxide thin film: by means of magnetron sputtering, an aluminum zinc oxide layer with the thickness of 800 nm is prepared on the substrate in which P2 is scribed.

Figure 5:
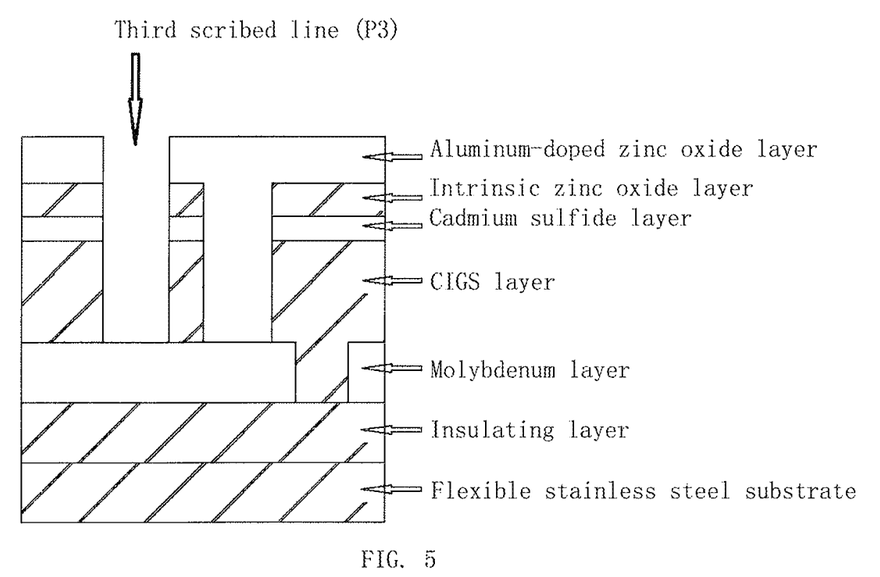
FIG. 5 is a schematic diagram of scribing of P3 according to the present invention.
Figure 8:
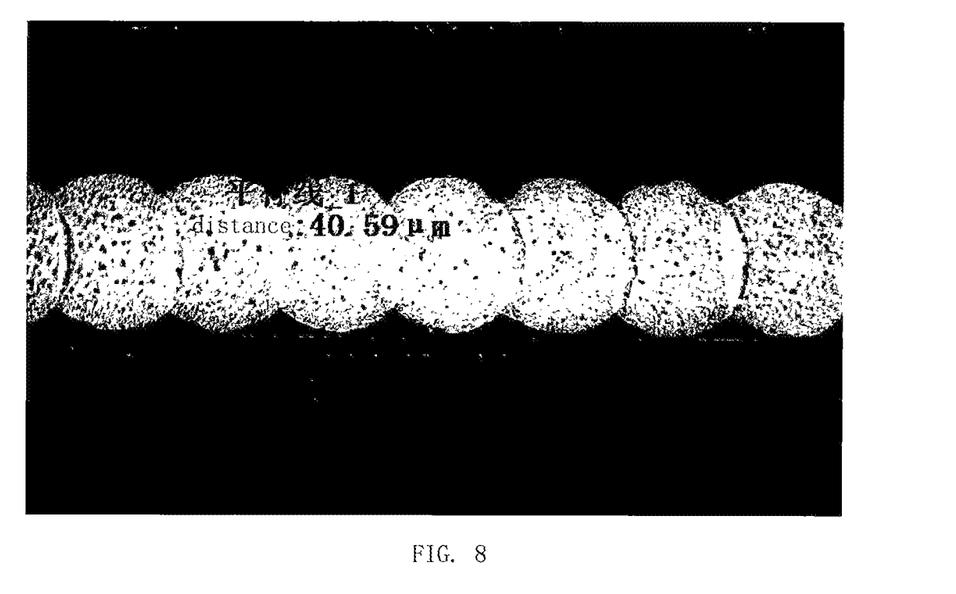
FIG. 8 is a topographic view after the scribing of P3 in Embodiment 1.

Step 9: scribing of P3: a picosecond laser with pulse width of 8 picoseconds, wavelength of 1064 nm, scribing power of 0.5 W, single pulse energy of 7.14 µJ, and repetition frequency of 70 kHz is used to scribe P3 in the sample with laser entering from the film-coated surface at a scribing speed of 2 m/s so that the aluminum-doped zinc oxide, the intrinsic zinc oxide layer, the cadmium sulfide layer and the CIGS layer are completely scribed off to expose the molybdenum layer, thus finishing the scribing of the module. The schematic view of the scribing is shown in FIG. 5. The width of the scribed line is 40.59 µm and the effect after the scribing is as shown in FIG. 8. The automatic tacking system is used to make sure that the scribed line P3 is parallel with the scribed line P1.

Embodiment 2

Step 1: an insulating layer is prepared on a flexible stainless steel substrate in the same way as Embodiment 1.

Step 2 is the same as that in Embodiment 1.

Step 3: scribing of P1: a sub-nanosecond laser with pulse width of 800 picoseconds, wavelength of 532 nm, scribing power of 2.7 W, single pulse energy of 33.75 µJ, repetition frequency of 80 kHz is used to scribe P1 in a sample with laser entering from the film-coated surface at a scribing speed of 2 m/s. The width of the scribed line is 40 µm, and the molybdenum layer in the scribed line is completely removed to expose the surface of the insulating layer, without damaging the insulating layer.

Steps 4-9 are the same as those in Embodiment 1.

Embodiment 3

Step 1 is the same as that in Embodiment 1.

Step 2 is the same as that in Embodiment 1.

Step 3: scribing of P1: a nanosecond laser with pulse width of 100 picoseconds, wavelength of 532 nm, scribing power of 3 W, single pulse energy of 37.5 µJ, repetition frequency of 80 kHz is used to scribe P1 in a sample with laser entering from the film-coated surface at a scribing speed of 2 m/s. The width of the scribed line is 38 µm, and the molybdenum layer in the scribed line is completely removed to expose the surface of the insulating layer, without damaging the insulating layer.

Steps 4-9 are the same as those in Embodiment 1.

Embodiment 4

Steps 1-6 are the same as those in Embodiment 1.

Step 7: scribing of P2: a sub-nanosecond laser with pulse width of 800 picoseconds, wavelength of 532 nm, scribing power of 0.4 W, single pulse energy of 1.2 µJ, and repetition frequency of 500 kHz is used to scribe P2 in the sample with laser entering from the film-coated surface at a scribing speed of 2 m/s. The width of the scribed line is 48 µm, and the intrinsic zinc oxide, cadmium sulfide and CIGS of the cell after the scribing are completely scribed off to expose the molybdenum layer. An automatic tacking system is used to make sure that the scribed line P2 is parallel with the scribed line P1.

Steps 8-9 are the same as those in Embodiment 1.

While the present invention has been described in detail with reference to the preferred embodiments described above, it should be appreciated that the foregoing description should not be construed as limiting the present invention. Various modifications and substitutions will be apparent to those skilled in the art upon reading the foregoing contents. Accordingly, the scope of the present invention should be defined by the appended claims.

The invention claimed is:

1. A full-laser scribing method for a flexible stainless steel substrate solar cell module, comprising
preparing an insulating layer on a stainless steel substrate, preparing a molybdenum thin film on the insulating layer, and using a laser to scribe off the molybdenum thin film to form a first scribed line (P1), wherein scribing off the molybdenum thin film includes scribing until reaching a surface of the insulating layer and focusing a beam of the laser using one or more focusing lenses to reach the surface of the insulating layer without damaging the insulating layer;
preparing the following film layers in sequence on the molybdenum layer in which P1 has been scribed: a CIGS layer, a cadmium sulfide layer and an intrinsic zinc oxide layer; using a laser to make scribe and form a second scribed line (P2); and
preparing an aluminum-doped zinc oxide layer on the intrinsic zinc oxide layer in which P2 has been scribed, and using a laser to make scribe again and form a third scribed line (P3).

2. The method according to claim 1, wherein scribing off the molybdenum thin film includes:
focusing the beam using a first focusing lens to produce a first focused beam;
expanding the first focused beam using a beam expander to produce an expanded beam; and
focusing the expanded beam using a second focusing lens to produce a second focused beam that impacts the molybdenum this film.

3. The method according to claim 2, wherein the expanded beam has a Gaussian distribution, wherein scribing off the molybdenum thin film includes shaping the expanded beam into a flat-topped distribution from the Gaussian distribution, and wherein focusing the expanded beam produces the second focused beam that is a flat-topped beam having uniform energy distribution.

4. The method according to claim 1, wherein the insulating thin film is one or more of oxide or nitride materials such as insulating silicon dioxide, silicon nitride, zinc oxide, aluminum oxide, or aluminum nitride.

5. The method according to claim 1, wherein the insulating thin film completely covers the stainless steel substrate.

6. The method according to claim 1, wherein the laser is one of a nanosecond laser, a sub-nanosecond laser, or a picosecond laser.

7. The method according to claim 1, wherein the first scribed line (P1) is scribed in a mode of film surface incidence or a back-surface incidence mode.

8. The method according to claim 1, wherein the insulating thin film has a thickness of 1000 nm to 2000 nm.

9. A full-laser scribing method for a flexible stainless steel substrate solar cell module, comprising:

(1) preparing an insulating layer on a flexible stainless steel substrate, wherein the insulating layer is one or more of oxide or nitride materials such as insulating silicon dioxide, silicon nitride, zinc oxide, aluminum oxide, or aluminum nitride, and the insulating layer completely covers the stainless steel substrate;

(2) preparing a molybdenum layer on the insulating layer;

(3) using a laser I to completely scribe off the molybdenum layer to form a first scribed line (P1), wherein the first scribed line (P1) is scribed till reaching the surface of the insulating layer so that sub-cells at both sides of the first scribed line (P1) are completely insulated without damaging the insulating layer; wherein laser from the laser I is focused by a focusing lens, and then subjected to beam expansion by a beam expander, and then laser energy is shaped into a flat-topped distribution from a Gaussian distribution by a laser shaping lens, and finally the laser is focused again by a focusing lens, to obtain a flat-topped beam with uniform energy distribution, and the molybdenum layer is scribed off by using the flat-topped beam;

(4) preparing a CIGS film layer on the molybdenum layer;

(5) preparing a cadmium sulfide film layer on the CIGS film layer;

(6) preparing an intrinsic zinc oxide film layer on the cadmium sulfide layer;

(7) using a laser II to scribe off the intrinsic zinc oxide layer, the cadmium sulfide layer and the CIGS layer at the same time to expose the molybdenum layer and thus form a second scribed line (P2), wherein the second scribed line (P2) completely scribes off three thin film layers, i.e., the intrinsic zinc oxide layer, the cadmium sulfide layer and the CIGS layer, without damaging the surface of the molybdenum layer, and the second scribed line (P2) keeps parallel with the first scribed line (P1);

(8) preparing an aluminum-doped zinc oxide layer on the intrinsic zinc oxide layer; and (9) using a laser III to scribe off the aluminum-doped zinc oxide layer, the intrinsic zinc oxide layer, the cadmium sulfide layer and the CIGS layer at the same time to expose the molybdenum layer and form a third scribed line (P3), thus completing inner connection of sub-cells of the solar cell module, wherein the third scribed line (P3) needs to completely scribe off four thin film layers, i.e., the aluminum-doped zinc oxide layer, the intrinsic zinc oxide layer, the cadmium sulfide layer and the CIGS layer, without damaging the surface of the molybdenum layer, wherein the third scribed line (P3) keeps parallel with the first scribed line (P1) and the second scribed line (P2).

10. The full-laser scribing method according to claim 9, wherein the laser I, the laser II and the laser III are all one of a nanosecond laser, a sub-nanosecond laser, or a picosecond laser.

11. The full-laser scribing method according to claim 10, wherein the nanosecond laser is a pulse fiber laser with a laser wavelength of one or more than two of 1064 nm, 532 nm and 355 nm, a beam mode of TEM00, a beam quality of less than 1.3, a pulse width of 1 nanosecond to 600 nanoseconds, a single pulse energy of 1 µJ to 2000 µJ, a pulse repetition frequency of 1 kHz to 1000 kHz, and an average power of 0 to 25 watts; the sub-nanosecond laser is a semiconductor laser with a laser wavelength of one or more than two of 1064 nm, 532 nm and 355 nm, a beam mode of TEM00, a beam quality of less than 1.3, a pulse width of 600 to 2000 picoseconds, a single pulse energy of 1 µJ to 300 µJ, a pulse repetition frequency of 10 kHz to 100 kHz, and an average power of 0 to 3 watts; the picosecond laser is a pulse fiber laser with a laser wavelength of one or more than two of 1064 nm, 532 nm and 355 nm, a beam mode of TEM00, a beam quality of less than 1.3, a pulse width of less than 10 picoseconds, a single pulse energy of 1 µJ to 40 µJ, a pulse repetition frequency of 1 Hz to 1000 KHz, and an average power of 0 to 6 watts.

12. The full-laser scribing method according to claim 9, wherein the first scribed line (P1) is scribed in a mode of film surface incidence or back surface incidence mode; the mode of film surface incidence means that the laser beams are in the direction of a thin film coated surface and are focused on a thin film surface through a focusing lens; the mode of back surface incidence means that laser beams are in a direction opposite to the thin film coated surface and focused on the stainless steel substrate through a focusing lens and cutting is achieved by means of heat conduction.

13. The full-laser scribing method according to claim 9, wherein the second scribed line (P2) and the third scribed line (P3) are both scribed in a mode of film surface incidence; the mode of film surface incidence means that the laser beams are in the direction of a thin film coated surface and are focused on a thin film surface through a focusing lens.

14. The full-laser scribing method according to claim 9, wherein the insulating layer in step (1) is an electrical insulating thin film made of one or more of oxide or nitride materials such as silicon dioxide, silicon nitride, zinc oxide, aluminum oxide, or aluminum nitride, and the insulating layer is 1000 nm to 2000 nm in thickness.

15. The full-laser scribing method according to claim 14, wherein the CIGS film layer in step (4) is 1.0-2.0 µm; the cadmium sulfide film layer in step (5) is 30 nm to 80 nm in thickness; the intrinsic zinc oxide film layer in step (6) is 50 nm to 150 nm in thickness.

16. The full-laser scribing method according to claim 9, wherein the molybdenum layer in step (2) is 600 nm to 1200 nm in thickness.

17. The full-laser scribing method according to claim 16, wherein the aluminum-doped zinc oxide layer in step (8) is 300 nm to_1000 nm in thickness.

18. The full-laser scribing method according to claim 9, wherein the CIGS film layer in step (4) is 1.0-2.0 µm; the cadmium sulfide film layer in step (5) is 30 nm to 80 nm in thickness; the intrinsic zinc oxide film layer in step (6) is 50 nm to 150 nm in thickness.

19. The full-laser scribing method according to claim 9, wherein the aluminum-doped zinc oxide layer in step (8) is 300 nm to 1000 nm in thickness.

* * * * *